United States Patent
Gao et al.

(10) Patent No.: US 11,735,603 B2
(45) Date of Patent: Aug. 22, 2023

(54) DISPLAY SUBSTRATE, DISPLAY PANEL AND METHOD FOR PREPARING DISPLAY SUBSTRATE

(71) Applicants: Chengdu BOE Optoelectronics Technology Co., Ltd., Chengdu (CN); BOE Technology Group Co., Ltd., Beijing (CN)

(72) Inventors: Tao Gao, Beijing (CN); Kuo Sun, Beijing (CN); Weifeng Zhou, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 200 days.

(21) Appl. No.: 17/333,098

(22) Filed: May 28, 2021

(65) Prior Publication Data
US 2022/0093654 A1    Mar. 24, 2022

(30) Foreign Application Priority Data
Sep. 23, 2020  (CN) .......................... 202011007604.0

(51) Int. Cl.
*H01L 27/14*  (2006.01)
*H01L 27/12*  (2006.01)
*H01L 29/66*  (2006.01)

(52) U.S. Cl.
CPC ...... *H01L 27/1251* (2013.01); *H01L 27/1229* (2013.01); *H01L 27/1255* (2013.01); *H01L 27/1259* (2013.01); *H01L 29/66757* (2013.01); *H01L 29/66969* (2013.01)

(58) Field of Classification Search
CPC ............ H01L 27/1251; H01L 27/1229; H01L 27/1255; H01L 27/1259; H01L 29/66757; H01L 29/66969; H01L 27/1225; H01L 27/127; H10K 59/12; H10K 71/00
USPC .............................................. 257/43, 59, 72
See application file for complete search history.

(56) References Cited

U.S. PATENT DOCUMENTS

2022/0393071 A1* 12/2022 Moon ................... H01L 27/156

* cited by examiner

*Primary Examiner* — Tan N Tran
(74) *Attorney, Agent, or Firm* — ArentFox Schiff LLP; Michael Fainberg

(57) ABSTRACT

Disclosed in embodiments of the present disclosure are a display substrate, a display panel, and a method for preparing the display substrate. The display substrate includes: a base substrate; a first source-drain layer, including first source-drain electrodes in the first area, and a first gate located in the second area; a first active layer, including a poly-silicon active layer located in the first area; a first gate layer, including a second gate and a connecting electrode located in the first area; a second active layer, including an oxide active layer located in the second area; a second gate layer, including a third gate located in the second area; and a second source-drain layer, including a second source-drain electrodes in the second area, and a lapping electrode located in the first area.

20 Claims, 14 Drawing Sheets

DISPLAY SUBSTRATE, DISPLAY PANEL AND METHOD FOR PREPARING DISPLAY SUBSTRATE

CROSS REFERENCE TO RELATED APPLICATIONS

The present disclosure claims priority of Chinese patent application No. 202011007604.0, filed with China National Intellectual Property Administration on Sep. 23, 2020, and entitled "Display substrate, display panel, display device and manufacturing method", the entire contents of which are incorporated herein by reference.

FIELD

The present disclosure relates to the field of display technology, in particular, to a display substrate, a display panel, and a method for preparing a display substrate.

BACKGROUND

Organic light emitting diode (OLED) display technology is different from traditional liquid crystal display (LCD) technology. OLED display panel does not need a backlight source, but uses organic light-emitting materials, which emit light when an electric current flow therethrough. By using a very thin organic material coating, an OLED display panel can be made lighter and thinner, and the OLED display panel has a larger viewing angle, and can significantly save electric energy.

Low temperature poly-silicon-oxide TFT (LTPO TFT) technology is an emerging thin film transistor technology in recent years. In theory, LTPO TFT can save 5-15% of power consumption compared with traditional low temperature poly-silicon thin film transistor (LIPS TFT) technology, such that the power consumption of the whole display screen is lower.

SUMMARY

Embodiments of the present disclosure provide a display substrate, a display panel, and a method for preparing a display substrate.

In a first aspect, an embodiment of the present disclosure provides an display substrate, provided with a first area in which a low temperature poly-silicon transistor is deposited and a second area in which an oxide transistor is deposited, and the display substrate including:

a base substrate;

a first source-drain layer on a side of the base substrate, the first source-drain layer includes first source-drain electrodes in the first area, and a first gate electrode in the second area;

a first active layer on a side of the first source-drain layer facing away from the base substrate, the first active layer includes a poly-silicon active layer in the first area;

a first gate layer on a side of the first active layer facing away from the first source-drain layer, the first gate layer includes a second gate electrode and a connecting electrode in the first area, and the connecting electrode is electrically connected to the first source-drain electrodes;

a second active layer on a side of the first gate layer facing away from the first active layer, the second active layer includes an oxide active layer in the second area;

a second gate layer on a side of the second active layer facing away from the first gate layer, the second gate layer including a third gate electrode in the second area; and a second source-drain layer on a side of the second gate layer facing away from the second active layer, the second source-drain layer includes second source-drain electrodes in the second area, and a lapping electrode in the first area, the second source-drain electrodes are electrically connected to the oxide active layer; one end of the lapping electrode is electrically connected to the connecting electrode, and another end of the lapping electrode is electrically connected to the poly-silicon active layer at the other end.

In some embodiments, the first source-drain layer further includes a first capacitor electrode, the first active layer further includes a second capacitor electrode, and the first gate layer further includes a third capacitor electrode, an orthographic projection of the third capacitor electrode on the base substrate and an orthographic projection of the second capacitor electrode on the base substrate have an overlap area, and the orthographic projection of the second capacitor electrode on the base substrate and an orthographic projection of the first capacitor electrode on the base substrate have an overlap area.

In some embodiments, the third capacitor electrode is provided with a hollow area, the second source-drain layer further includes a capacitor connecting line, and the capacitor connecting line is electrically connected to the second capacitor electrode through the hollow area.

In some embodiments, a first gate insulating layer is further provided between the first active layer and the first gate layer, and a buffer layer is further provided between the first active layer and the first source-drain layer; and in an area where the first gate electrode is located, the buffer layer and the first gate insulating layer are provided with a first groove exposing the first gate electrode; and the oxide transistor is located in an area where the first groove is located.

In some embodiments, the display substrate includes a display area, and a bending area in a peripheral area of the display area;

the display substrate is provided with, in the bending area, a second groove exposing the base substrate; the second source-drain layer further includes, in the bending area, a power line located in the second groove; and the display substrate further includes a planarization layer on a side of the second source-drain layer facing away from the second gate layer, the planarization layer fills other areas of the second groove than an area where the power line is located.

In some embodiments, the display substrate further includes a second gate insulating layer between the second active layer and the second gate layer;

a pattern of the second gate insulating layer is same as a pattern of the third gate electrode; and an area of an orthographic projection of the second gate insulating layer on the base substrate is smaller than an area of an orthographic projection of the oxide active layer on the base substrate.

In some embodiments, a material of the first source-drain layer is aluminum alloy material or molybdenum alloy material.

In some embodiments, the oxide transistor is a switching transistor, and the low-temperature poly-silicon transistor is a driving transistor.

In a second aspect, embodiments of the present disclosure further provide a display panel including the display substrate in any of the above embodiments.

In a third aspect, an embodiment of the present disclosure provides a method for preparing a display substrate, including:

providing a base substrate;

forming, on a side of the base substrate, a first source-drain layer having first source-drain electrodes in a first area and a first gate electrode in a second area;

forming, on a side of the first source-drain layer facing away from the base substrate, a first active layer having a poly-silicon active layer in the first area;

forming, on a side of the first active layer facing away from the first source-drain layer, a first gate layer having a second gate electrode and a connecting electrode located in the first area, the connecting electrode is electrically connected to the first source-drain electrodes; forming, on a side of the first gate layer facing away from the first active layer, a second active layer having an oxide active layer;

forming, on a side of the second active layer facing away from the first gate layer, a second gate layer having a third gate electrode in the second area; and forming, on a side of the second gate layer facing away from the second active layer, a second source-drain layer having second source-drain electrodes in the second area and a lapping electrode in the first area, the second source-drain electrodes are electrically connected to the oxide active layer, one end of the lapping electrode is electrically connected to the connecting electrode, and another end of the lapping electrode is electrically connected to the poly-silicon active layer at the other end.

In some embodiments, when forming, on the side of the base substrate, the first source-drain layer, the method further includes forming a first capacitor electrode;

when forming, on the side of the first source-drain layer facing away from the base substrate, the first active layer, the method further includes forming a second capacitor electrode; and when forming, on the side of the first active layer facing away from the first source-drain layer, the first gate layer, the method further includes forming a third capacitor electrode.

In some embodiments, forming the third capacitor electrode includes forming the third capacitor electrode provided with a hollow area; and when forming, on the side of the second gate layer facing away from the second active layer, the second source-drain layer, the method further includes forming a capacitor connecting line electrically connected to the second capacitor electrode through the hollow area.

In some embodiments, after forming, on the side of the base substrate, the first source-drain layer, and before forming, on the side of the first source-drain layer facing away from the base substrate, the first active layer, the method further includes forming a buffer layer; and after forming, on the side of the first source-drain layer facing away from the base substrate, the first active layer, and before forming, on the side of the first active layer facing away from the first source-drain layer, the first gate layer, the method further includes forming a first gate insulating layer, and etching the first gate insulating layer to form a first groove exposing the first gate electrode.

In some embodiments, when forming, on the side of the second gate layer facing away from the second active layer, the second source-drain layer, the method further includes forming a power line.

DETAILED DESCRIPTION OF THE EMBODIMENTS

To make the objectives, technical solutions and advantages of embodiments of the present disclosure clearer, the technical solutions in embodiments of the present disclosure will be described clearly and completely in conjunction with the accompanying drawings in embodiments of the present disclosure. Obviously, the described embodiments are only a part of embodiments of the present disclosure, and not all embodiments. Based on embodiments described herein, all other embodiments obtained by those of ordinary skill in the art without creative work shall fall into the protection scope of the present disclosure.

Unless otherwise defined, technical or scientific terms used in the present disclosure shall have ordinary meanings understood by those of ordinary skill in the art to which the present disclosure pertains. The words "first", "second" and the like used in present disclosure do not indicate any order, quantity or importance, but are only used to distinguish different components. The word "comprise" or "include" or the like means that an element or item appearing before such a word covers listed elements or items appearing after the word and equivalents thereof, and does not exclude other elements or items. The word "connect" or "interconnect" or the like is not limited to physical or mechanical connections, but may include electrical connections, regardless of direct or indirect connections. The words "up", "down", "left", "right" and the like are only used to indicate a relative positional relationship. When the absolute position of a described object changes, the relative positional relationship may also change accordingly.

To keep the following description of embodiments of the present disclosure clear and concise, detailed description of known functions and known components is omitted in the present disclosure.

Figure 1:
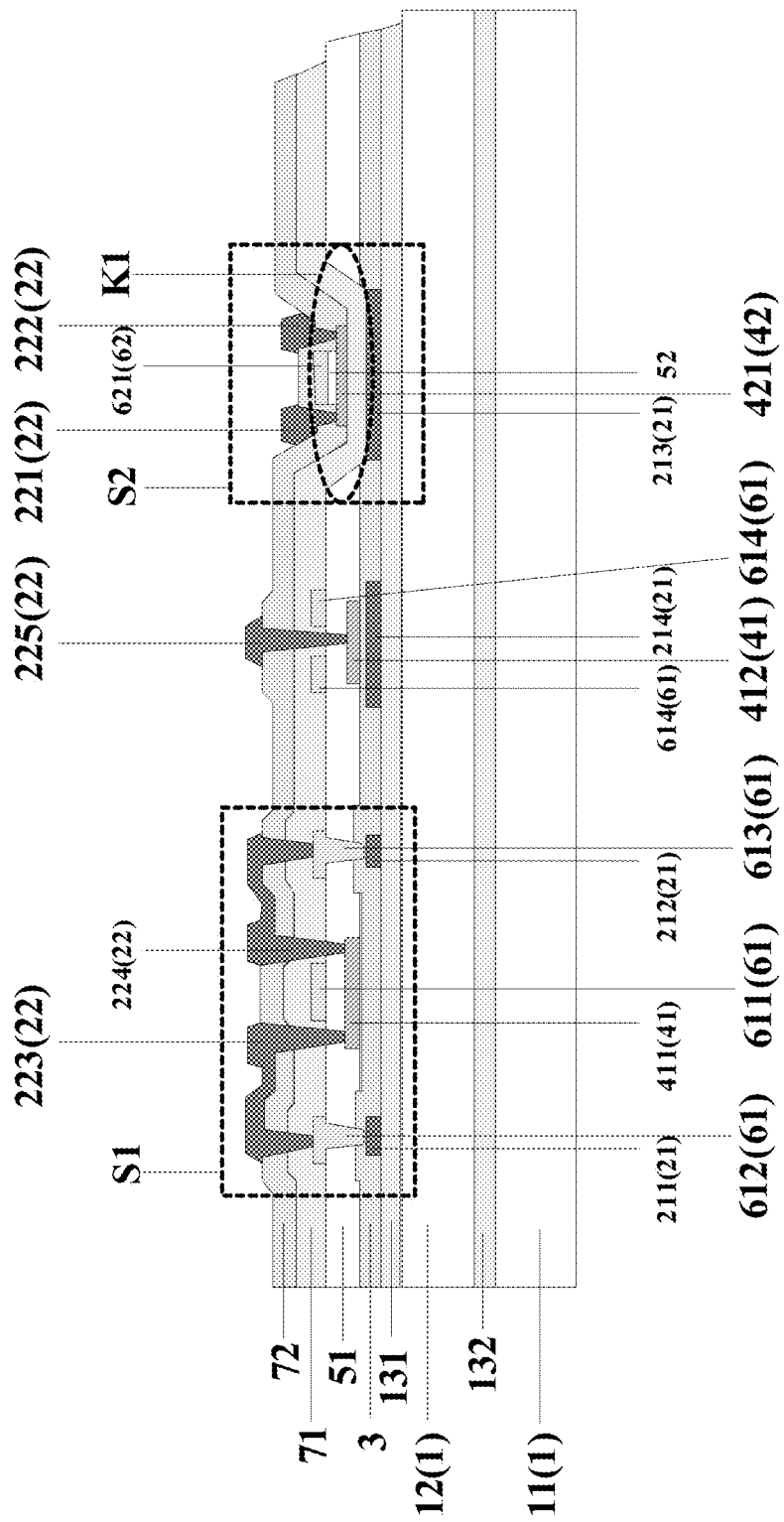
FIG. 1 is a schematic structural diagram of a display substrate provided in an embodiment of the present disclosure.

Referring to FIG. 1, an embodiment of the present disclosure provides a display substrate, the display substrate is provided with a first area S1 in which a low temperature poly-silicon transistor is deposited and a second area S2 in which an oxide transistor is deposited.

The display substrate includes a base substrate 1, the base substrate 1 may include a first base substrate 11 and a second base substrate 12, and a second barrier layer 132 may be provided between the first base substrate 11 and the second base substrate 12. In some embodiments, the base substrate 1 may also be a single-layer structure; and the material of base substrate 1 may be polyimide, and the thickness of each layer of base substrate may be 5 um-20 um.

The display substrate further includes a first source-drain layer 21 on a side of the base substrate 1, the first source-drain layer 21 includes first source-drain electrodes (the first source-drain may include a first source 211 and a first drain 212) located in the first area S1, and a first gate electrode 213 located in the second area S2. In some embodiments, a first barrier layer 131 may also be provided between the first source-drain layer 21 and the base substrate 1; a material of the first source-drain layer 21 may be aluminum alloy material, or molybdenum alloy material; the first barrier layer 131 and the second barrier layer 132 may be made of SiOx, and a thickness of the first barrier layer 131 and/or a thickness of the second barrier layer 132 is 400 um-600 um; and the oxide transistor may be a double-gate transistor to have relatively high stability and mobility, and the first gate electrode 213 may be used as a bottom gate of the oxide transistor.

The display substrate further includes a first active layer 41 located on a side of the first source-drain layer 21 facing away from the base substrate 1, the first active layer 41 includes a poly-silicon active layer 411 located in the first area S1. In some embodiments, a buffer layer 3 may also be provided between the first active layer 41 and the first source-drain layer 21; and the buffer layer 3 may be a composite layer of SiNx and SiO, with a thickness of about 300 u-500 um.

The display substrate further includes a first gate layer 61 located on a side of the first active layer 41 facing away from the first source-drain layer 21. The first gate layer 61 including a second gate electrode 611 and a connecting electrode (the connecting electrode may include a first connecting electrode 612 and a second connecting electrode 613) located in the first area S1. In some embodiments, a first gate insulating layer 51 may also be provided between the first gate layer 61 and the first active layer 41; the connecting electrode is electrically connected to the first source-drain electrodes; the first connecting electrode 612 may be electrically connected to the first source electrode 211 through a via hole running through the first gate insulating layer 51 and the buffer layer 3, and the second connecting electrode 613 may be electrically connected to the first drain electrode 212 through a via hole running through the first gate insulating layer 51 and the buffer layer 3. In some embodiments, the first gate layer 61 may be made of molybdenum or molybdenum alloy; and the first gate insulating layer 51 may be made of SiO.

The display substrate further includes a second active layer 42 located on a side of the first gate layer 61 facing away from the first active layer 41, the second active layer 42 includes an oxide active layer 421 located in the second area S2. In some embodiments, a first interlayer dielectric layer 71 may also be provided between the second active layer 42 and the first gate layer 61; and the first interlayer dielectric layer 71 may be a composite layer of SiN and SiO, with a thickness of 400 um-600 um, with SiN being in a lower layer and SiO being in an upper layer.

The display substrate further includes a second gate layer 62 located on a side of the second active layer 42 facing away from the first gate layer 61, the second gate layer 62 includes a third gate electrode 621 located in the second area S2. In some embodiments, a second gate insulating layer 52 may also be provided between the second gate layer 62 and the second active layer 42, the second gate insulating layer 52 layer and the third gate electrode 621 have same patterns and are prepared by a step etching method by using a mask process, to expose a portion of the oxide active layer 421 for contact with a second source-drain layer.

The display substrate further includes the second source-drain layer 22 located on a side of the second gate layer 62 facing away from the second active layer 42, the second source-drain layer 22 includes a second source-drain electrodes (the second source-drain may include a second source 221 and a second drain 222) located in the second area S2, and a lapping electrode (the lapping electrode may include a first lapping electrode 223 and a second lapping electrode 224) located in the first area S1. In some embodiments, a second interlayer dielectric layer 72 may also be provided between the second source-drain 22 and the second gate layer 62, the second source-drain electrodes is electrically connected to the oxide active layer 421; and the second source electrode 221 may contact one end of the oxide active layer 421 through a via hole running through the second interlayer dielectric layer 72, and the second drain electrode 222 may contact the other end of the oxide active layer 421 through a via hole running through the second interlayer dielectric layer 72.

In some embodiments, one end of the lapping electrode is electrically connected to the connecting electrode and the other end of the lapping electrode is electrically connected to the poly-silicon active layer. In some embodiments, one end of the first lapping electrode 223 may be electrically connected to the first connecting electrode 612 through a via hole running through the second interlayer dielectric layer 72 and the first interlayer dielectric layer 71, and the other end of the first lapping electrode may contact one end of the poly-silicon active layer 411 through a via hole running through the second interlayer dielectric layer 72, the first interlayer dielectric layer 71 and the first gate insulating layer 51. And, one end of the second lapping electrode 224 may be electrically connected to the second connecting electrode 613 through a via hole running through the second interlayer dielectric layer 72 and the first interlayer dielectric layer 71, and the other end the second lapping electrode 224 may contact the other end of the poly-silicon active layer 411 through a via hole running through the second interlayer dielectric layer 72, the first interlayer dielectric layer 71 and the first gate insulating layer 51. In some embodiments, the second interlayer dielectric layer 72 may be made of SiO, and may have a thickness of 400 um-600 um.

In the display substrate provided in embodiments of the present disclosure, the first source-drain of the low-temperature poly-silicon transistor and the first gate electrode of the oxide transistor are disposed in a first source-drain layer, and the second gate electrode of the low-temperature poly-silicon transistor and the connecting electrode are disposed in the first gate layer, and the lapping electrode of the low-temperature poly-silicon transistor and the second source-drain of the oxide transistor are disposed in the second source-drain layer. The film layers of the oxide transistor are prepared simultaneously when the film layers of the low-temperature poly-silicon transistor are prepared, which achieves a high degree of integration and enables the display substrate to have both the low-temperature poly-silicon transistor and the oxide transistor, thus reducing the power consumption of the display substrate.

In some embodiments, referring to FIG. 1, the first source-drain layer 21 further includes a first capacitor electrode 214, the first active layer 41 further includes a second capacitor electrode 412, and the first gate layer 61 further includes a third capacitor electrode 614. An orthographic projection of the third capacitor electrode 614 on the base substrate 1 and an orthographic projection of the second capacitor electrode 412 on the base substrate 1 have an overlap area, and the orthographic projection of the second capacitor electrode 412 on the base substrate 1 and an orthographic projection of the first capacitor electrode 214 on the base substrate 1 have an overlap area. In some embodiments, a storage capacitor Cst is a composite capacitor, which is composed of a capacitor formed by the first capacitor electrode 214 and the second capacitor electrode 412, and a capacitor formed by the second capacitor electrode 412 and the third capacitor electrode 614, and the capacitor formed by the first capacitor electrode 214 and the second capacitor electrode 412 is connected in parallel with the capacitor formed by the second capacitor electrode 412 and the third capacitor electrode 614. Thus, the storage capacitor Cst has larger storage capacitance than a storage capacitor of the prior art.

In some embodiments, the third capacitor electrode 614 has a hollow area; and the second source-drain layer 22 further includes a capacitor connecting line 225, the capacitor connecting line 225 passing through the hollow area and being electrically connected to the second capacitor electrode 412. That is, the third capacitor electrode 614 has a hole in the middle to facilitate connection between the electrode and an external trace.

In some embodiments, referring to FIG. 1, in an area where the first gate electrode 213 is located, the buffer layer 3 and the first gate insulating layer 51 have a first groove K1 exposing the first gate electrode 213; and the oxide transistor is located in the area where the first groove K1 is located. In some embodiments, as the buffer layer 3 and the first gate insulating layer 51 have the first groove K1 exposing the first gate electrode 213 in the area where the first gate electrode 213 is located, the spacing between the two gates of the formed double-gate oxide transistor may be small, and leakage current of the oxide transistor may be low.

Figure 2:
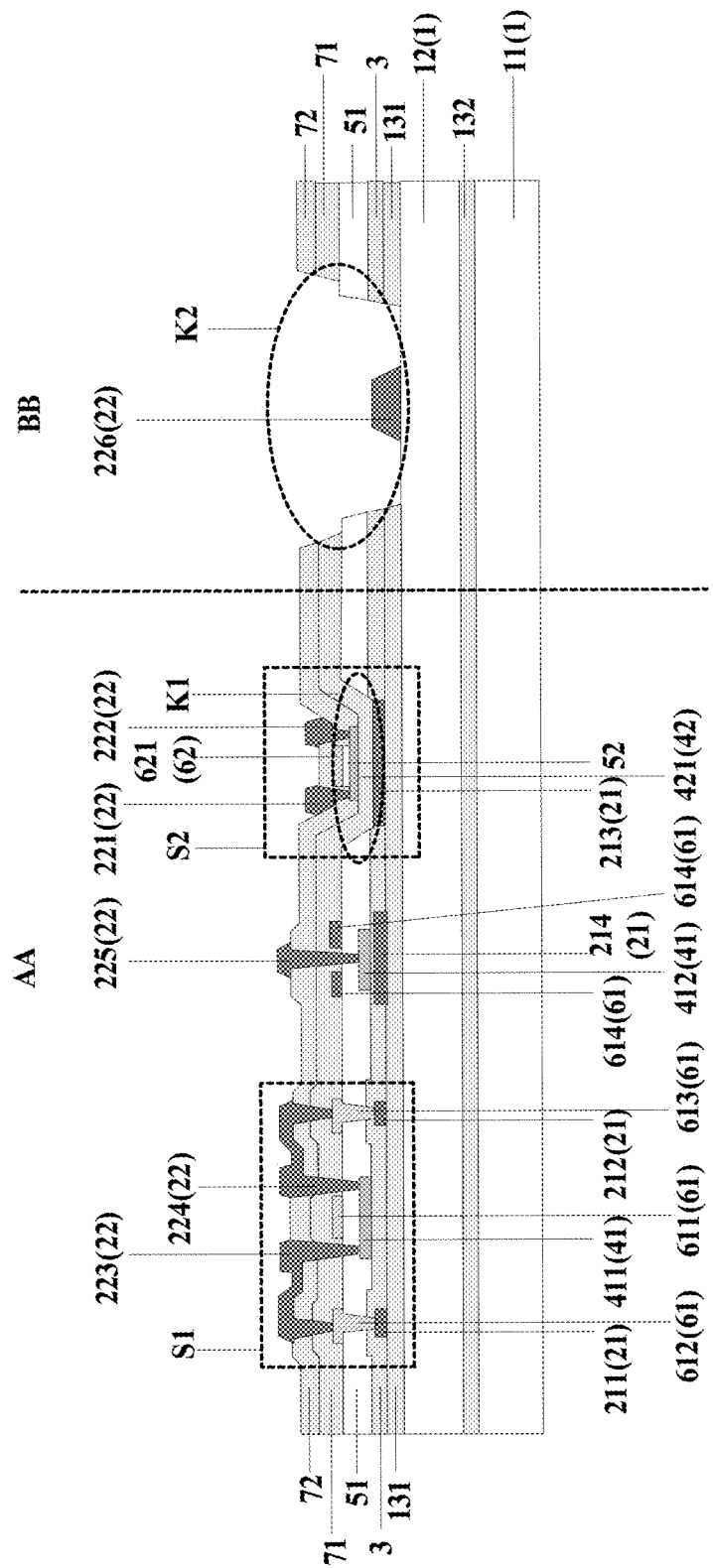
FIG. 2 is another schematic structural diagram of a display substrate provided in an embodiment of the present disclosure.
Figure 3:
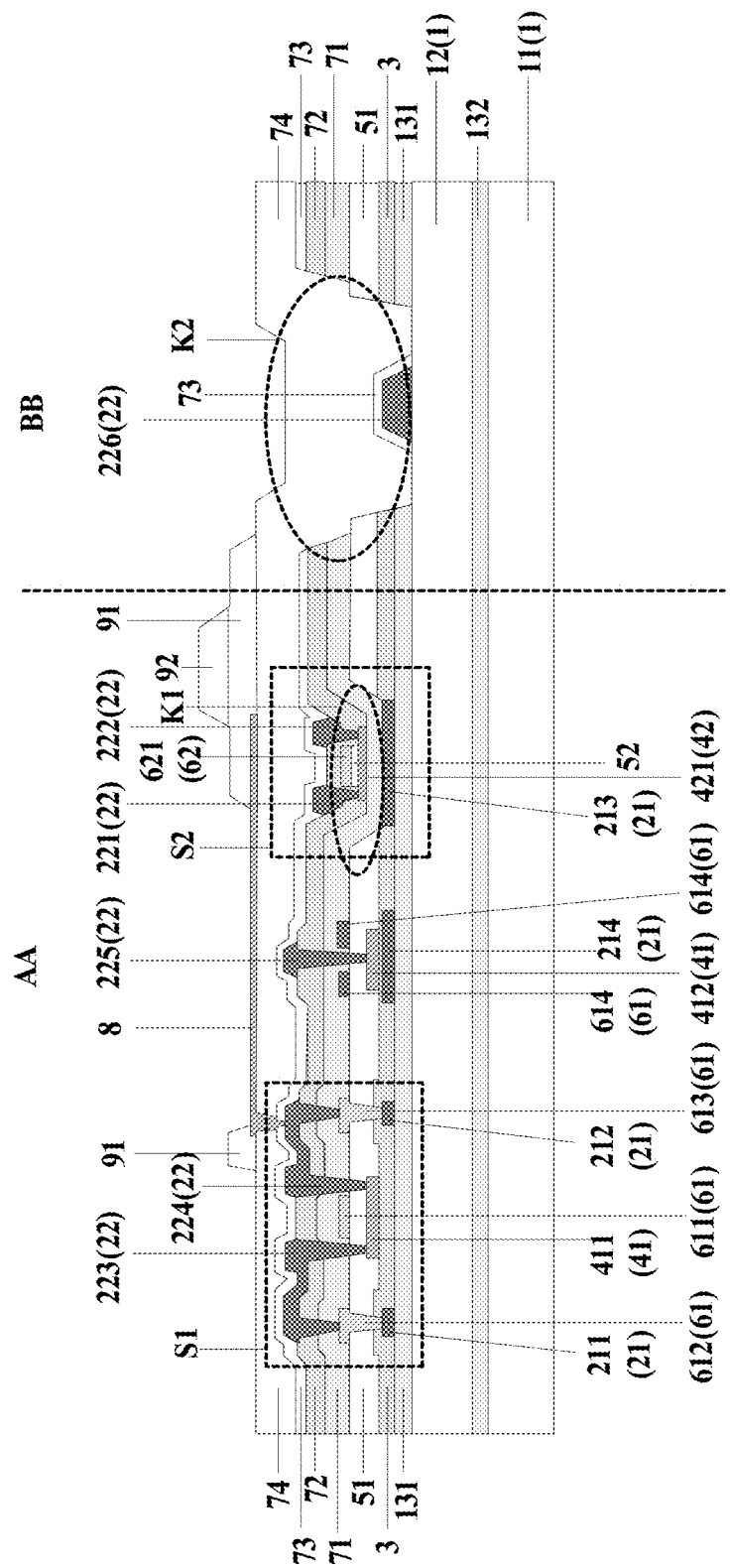
FIG. 3 is another schematic structural diagram of display substrate provided in an embodiment of the present disclosure.

In some embodiments, referring to FIG. 2, the display substrate includes a display area AA, and a bending area BB located at the periphery of the display area AA; the display substrate has, in the bending area BB, a second groove K2 exposing the base substrate 1; the second source-drain layer 22 further includes, in the bending area BB, a power line 226 located in the second groove K2. In some embodiments, referring to FIG. 3, a planarization layer 74 is further provided on a side of the second source-drain layer 22 facing away from the second gate layer 62, the planarization layer 74 filling other areas of the second groove K2 than an area where the power line 226 is located.

In some embodiments, a passivation layer 73 may also be provided between the planarization layer 74 and the second source-drain layer 22; an anode 8 may also be provided on a side of the planarization layer 74 facing away from the passivation layer 73, and a pixel defining layer 91 may also be provided on a side of the anode 8 facing away from the planarization layer 74, and a spacer 92 may also be provided on a side of the pixel defining layer 91 facing away from the anode 8.

In some embodiments, referring to FIG. 1, a pattern of the second gate insulating layer 52 is same as a pattern of the third gate electrode 621; and the area of an orthographic projection of the second gate insulating layer 52 on the base substrate 1 is smaller than the area of an orthographic projection of the oxide active layer 421 on the base substrate 1, to achieve contact between the second source-drain formed subsequently and the oxide active layer 421.

In some embodiments, the oxide transistor is a switching transistor, and the low-temperature poly-silicon transistor is a driving transistor.

Based on the same inventive concept, an embodiment of the present disclosure further provides a display panel, which includes the display substrate provided in embodiments of the present disclosure.

Based on the same inventive concept, an embodiment of the present disclosure further provides a display device, which includes the display panel provided in embodiments of the present disclosure.

Figure 4:
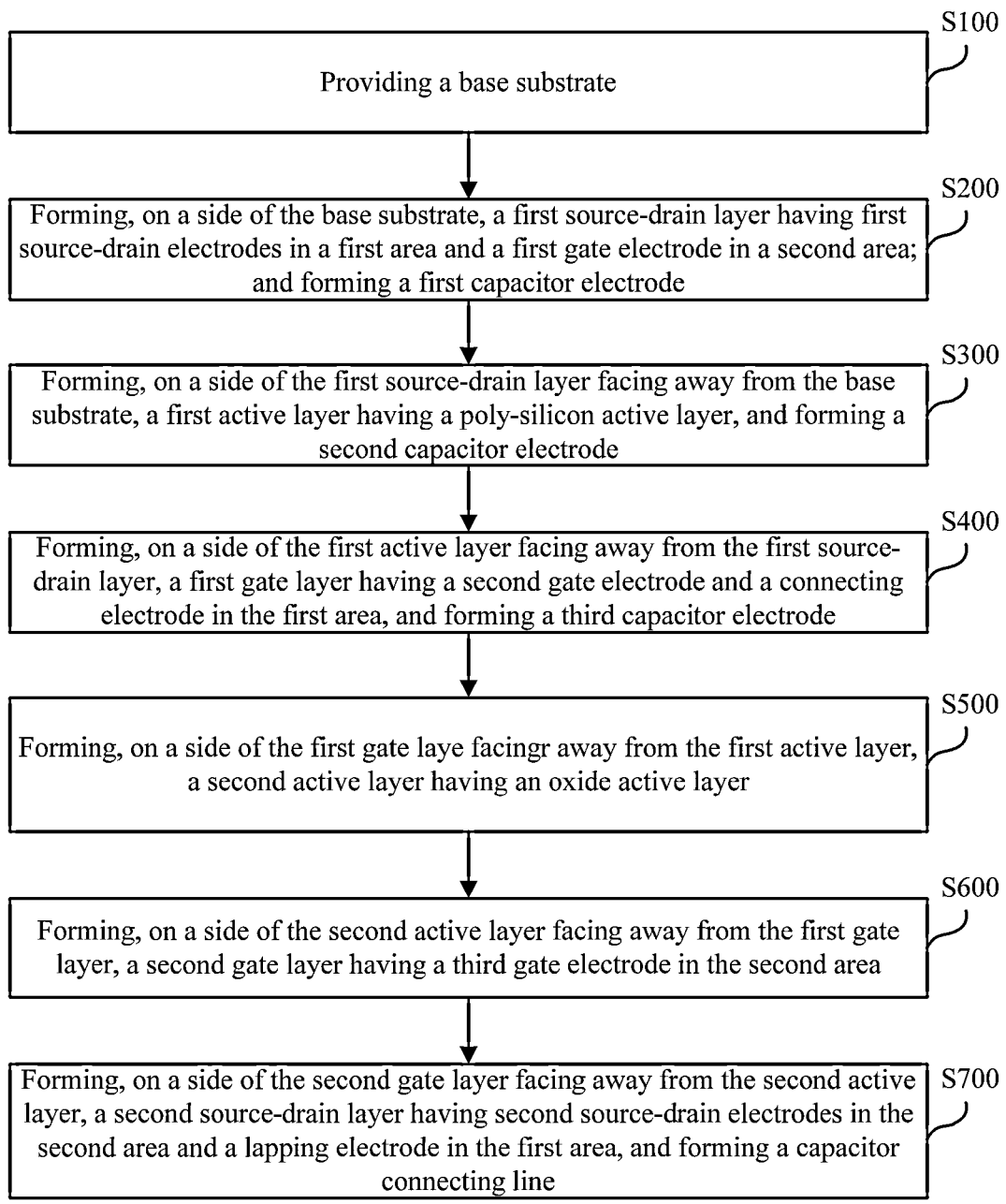
FIG. 4 is a schematic diagram of a preparing process of a display substrate provided in an embodiment of the present disclosure.

Based on the same inventive concept, an embodiment of the present disclosure further provides a method for preparing a display substrate, as shown in FIG. 4, including:

step S100, providing a base substrate;

step S200, forming, on a side of the base substrate, a first source-drain layer, and the first source-drain layer includes first source-drain electrodes in a first area and a first gate electrode in a second area;

when forming, on the side of the base substrate, the first source-drain layer having the first source-drain in the first area and the first gate electrode in the second area, the method further includes forming a first capacitor electrode;

step S300, forming, on a side of the first source-drain layer facing away from the base substrate, a first active layer, and the first active layer includes a poly-silicon active layer located in the first area;

when forming, on the side of the first source-drain layer facing away from the base substrate, the first active layer having a poly-silicon active layer, the method further includes forming a second capacitor electrode;

step S400, forming, on a side of the first active layer facing away from the first source-drain layer, a first gate layer, and the first gate layer includes a second gate electrode and a connecting electrode in the first area, the connecting electrode is electrically connected to the first source-drain electrodes;

when forming, on the side of the first active layer facing away from the first source-drain layer, the first gate layer having the second gate electrode and the connecting electrode in the first area, the method further includes forming a third capacitor electrode having a hollow area, and the connecting electrode is electrically connected to the first source-drain;

step S500, forming, on a side of the first gate layer facing away from the first active layer, a second active layer, and the second active layer includes an oxide active layer located in the second area;

step S600, forming, on a side of the second active layer facing away from the first gate layer, a second gate layer, and the second gate layer includes a third gate electrode in the second area; and step S700, forming, on a side of the second gate layer facing away from the second active layer, a second source-drain layer, and the second source-drain layer includes a second source-drain electrodes in the second area and a lapping electrode in the first area;

when forming, on the side of the second gate layer facing away from the second active layer, the second source-drain layer having the second source-drain in the second area and the lapping electrode in the first area, the method further includes forming a capacitor connecting line electrically connected to the second capacitor electrode through the hollow area;

when forming, on the side of the second gate layer facing away from the second active layer, the second source-drain layer having a second source-drain in the second area and the lapping electrode in the first area, the method further includes forming a power line;

the second source-drain electrodes are electrically connected to the oxide active layer, and the lapping electrode is electrically connected to the connecting electrode at one end and electrically connected to the poly-silicon active layer at the other end.

Figure 5:
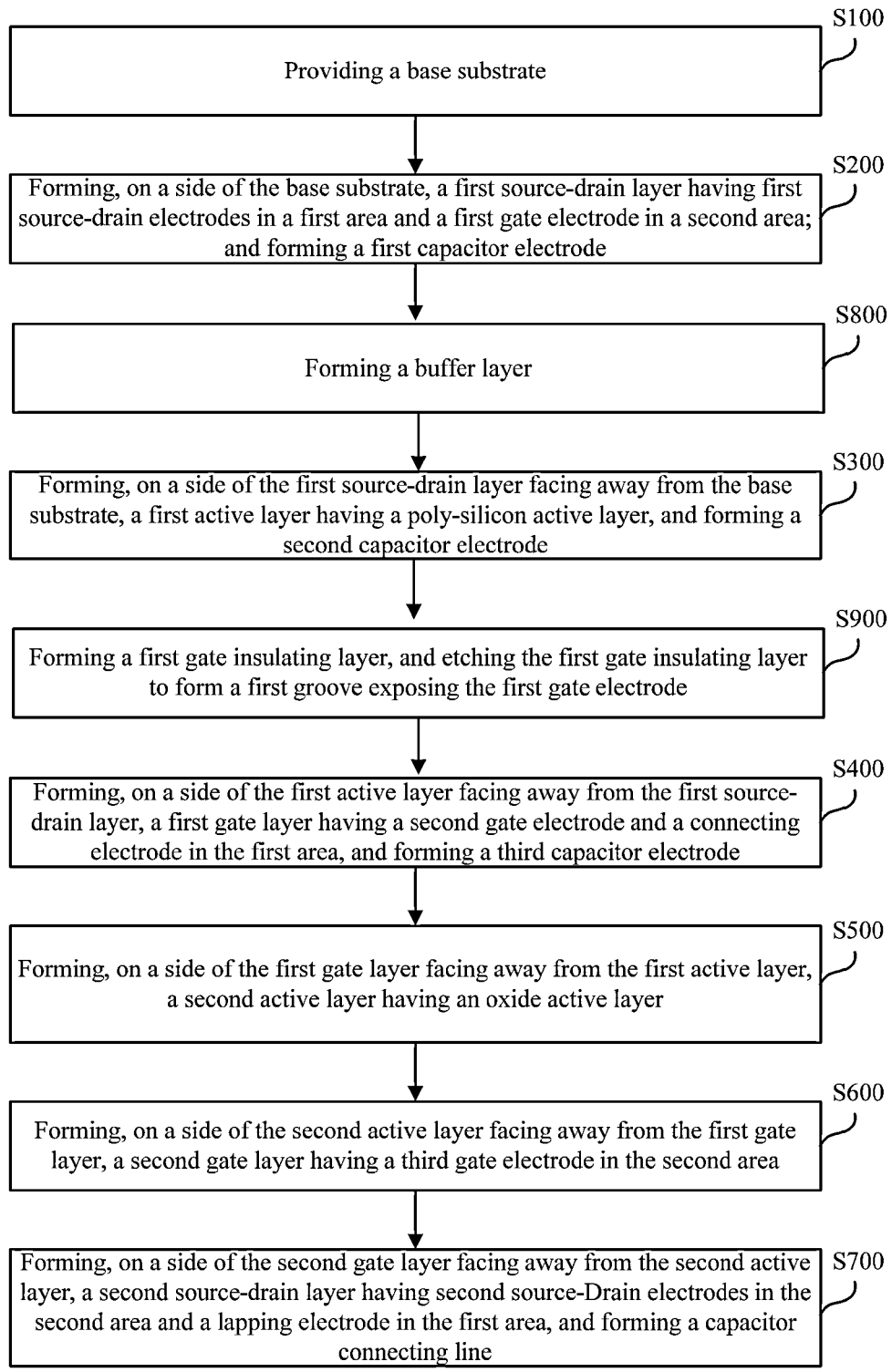
FIG. 5 is another schematic diagram of a preparing process of a display substrate provided in an embodiment of the present disclosure.

In some embodiments, referring to FIG. 5, after step S200 and before step S300, i.e., after forming, on a side of the base substrate, a first source-drain layer having first source-drain electrodes in a first area and a first gate electrode in a second area, and before forming, on a side of the first source-drain layer away from the base substrate, a first active layer having a poly-silicon active layer, the method further include step S800, forming a buffer layer.

In some embodiments, after step S300 and before step S400, i.e., after forming, on a side of the first source-drain layer facing away from the base substrate, a first active layer having a poly-silicon active layer, and before forming, on a side of the first active layer away from the first source-drain layer, a first gate layer having a second gate electrode and a connecting electrode in the first area, the manufacturing method further includes step S900, forming a first gate insulating layer, and etching the first gate insulating layer to form a first groove exposing the first gate electrode.

To more clearly understand the method for preparing the display substrate provided in embodiments of the present disclosure, the method is further described in detail below in conjunction with FIGS. 6-14.

Figure 6:
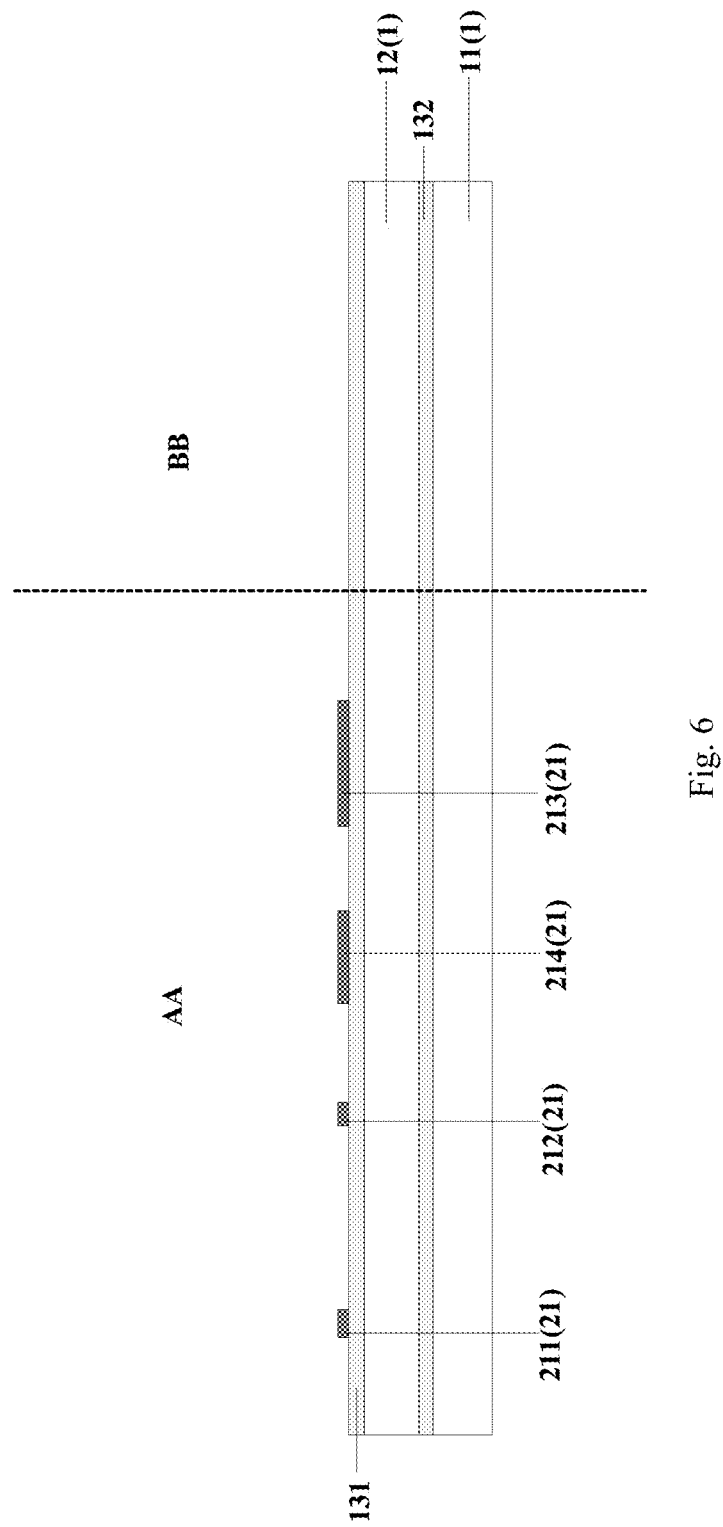
FIG. 6 is a schematic structural diagram of a display substrate after a first source-drain layer is prepared, provided in an embodiment of the present disclosure.

Step I. A base substrate 1 is prepared. The base substrate 1 may be a flexible substrate. The base substrate may be made of polyimide, with a thickness of about 5 um-20 um. The base substrate may be a single-layer structure, or a double-layer structure. A barrier layer (which may be a first barrier layer 131 and a second barrier layer 132) is provided on each layer of polyimide substrate. The barrier layer may be made of SiOx, with a thickness of 400 um-600 um. A metal layer, the material of which may be Al alloy material or Mo alloy material, is deposited over the first barrier layer 131. The metal layer is patterned to prepare first source-drain electrodes (which may include a first source 211 and a first drain 212) of an LTPS TFT, and a data line (i.e., the first source 211). In addition, a bottom gate electrode layer (i.e., a first gate electrode 213) of an oxide TFT is prepared at the position of the oxide TFT. A storage capacitor Cst is a composite capacitor formed by parallel connection of a capacitor C1 composed of a first capacitor electrode 214 (SD1) of a first source-drain layer 21 and a second capacitor electrode 412 of a first active layer 41 formed subsequently, and a capacitor C2 composed of a second capacitor electrode 412 of the first active layer 41 formed subsequently and a third capacitor electrode 614 of a first gate layer 61, as shown in FIG. 6.

Figure 7:
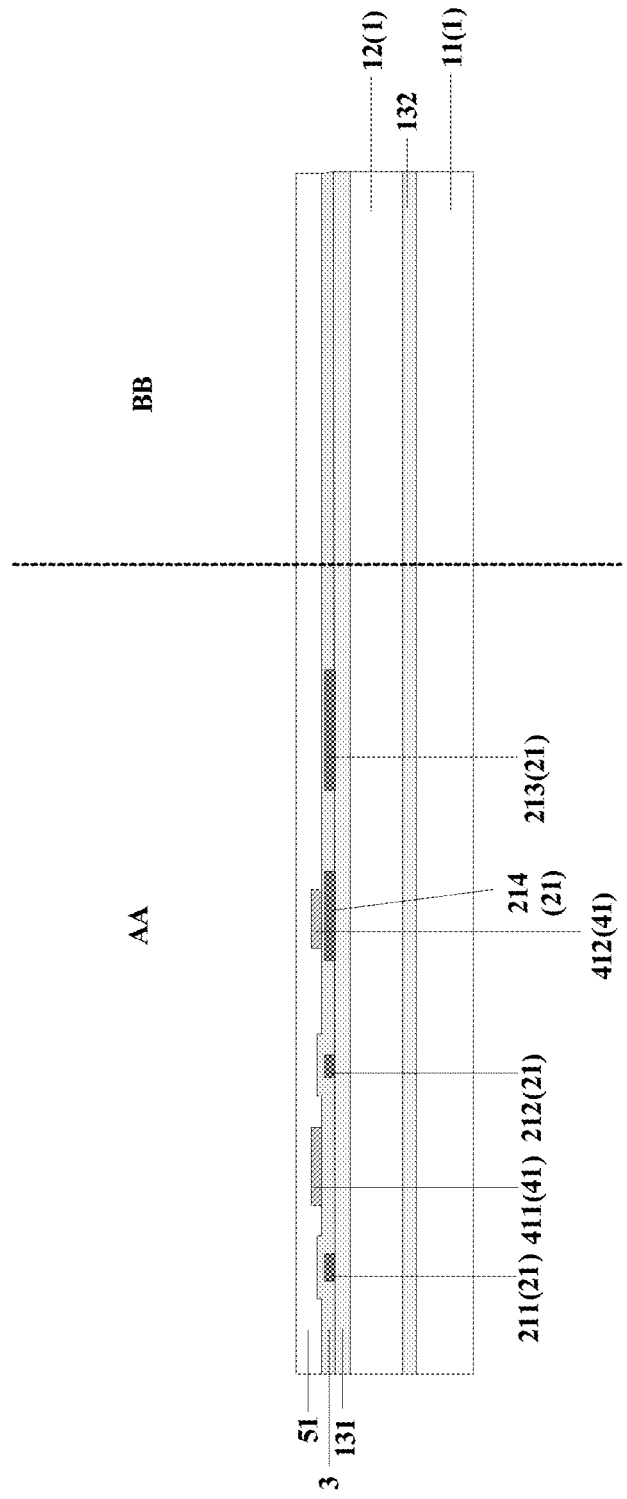
FIG. 7 is a schematic structural diagram of a display substrate after a first gate insulating layer is prepared, provided in an embodiment of the present disclosure.

Step II. Then a buffer layer 3 is deposited, the material of the buffer layer may be a composite layer of SiNx and SiO, with a thickness of about 300 um-500 um. Then an a-Si layer is deposited, and a P—Si layer is prepared by using a dehydrogenation and excimer laser annealing (ELA) process, and then patterned to prepare a silicon island layer of P—Si (i.e., poly-silicon active layer 411) and the second electrode 412 of the storage capacitor Cst. Then a GI layer (first gate insulating layer 51) is deposited, the material of the GI layer may be SiO, as shown in FIG. 7.

Figure 8:
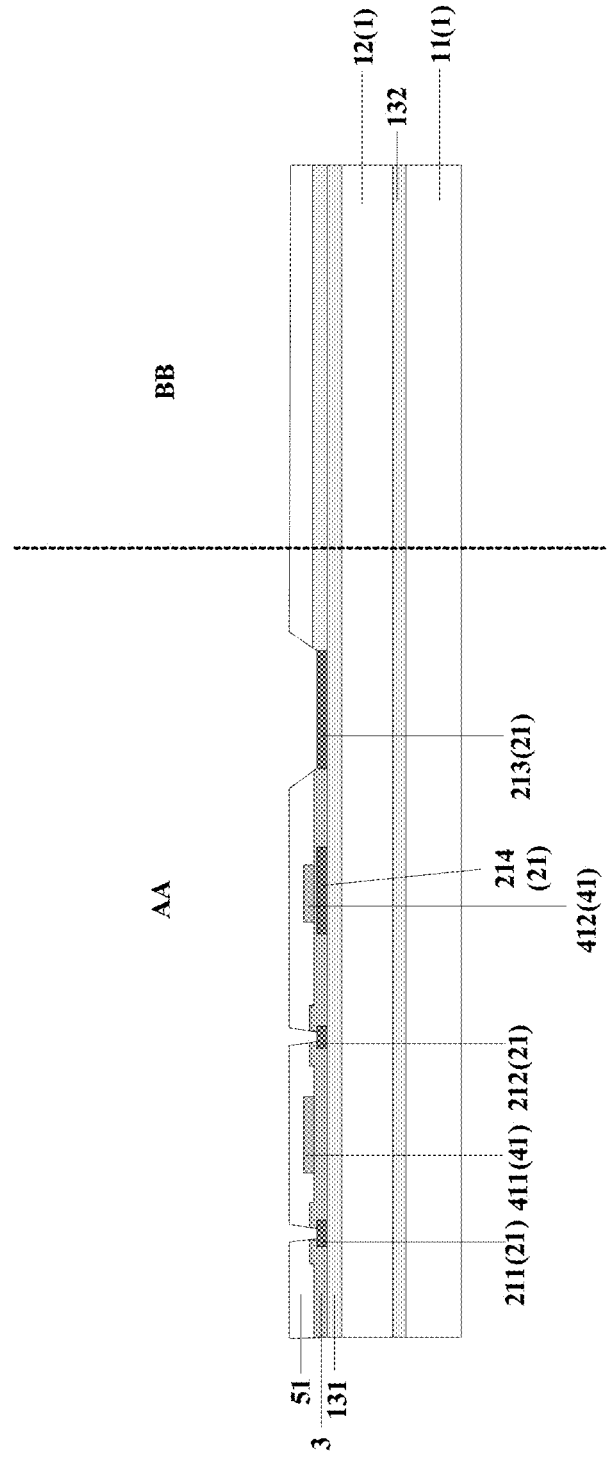
FIG. 8 is a schematic structural diagram of a display substrate after via holes of a first source-drain layer is prepared, provided in an embodiment of the present disclosure.

Step III. Via holes exposing the first source 211 and exposing the first drain 212, and via holes exposing the first gate electrode 213 are prepared by patterning, as shown in FIG. 8.

Figure 9:
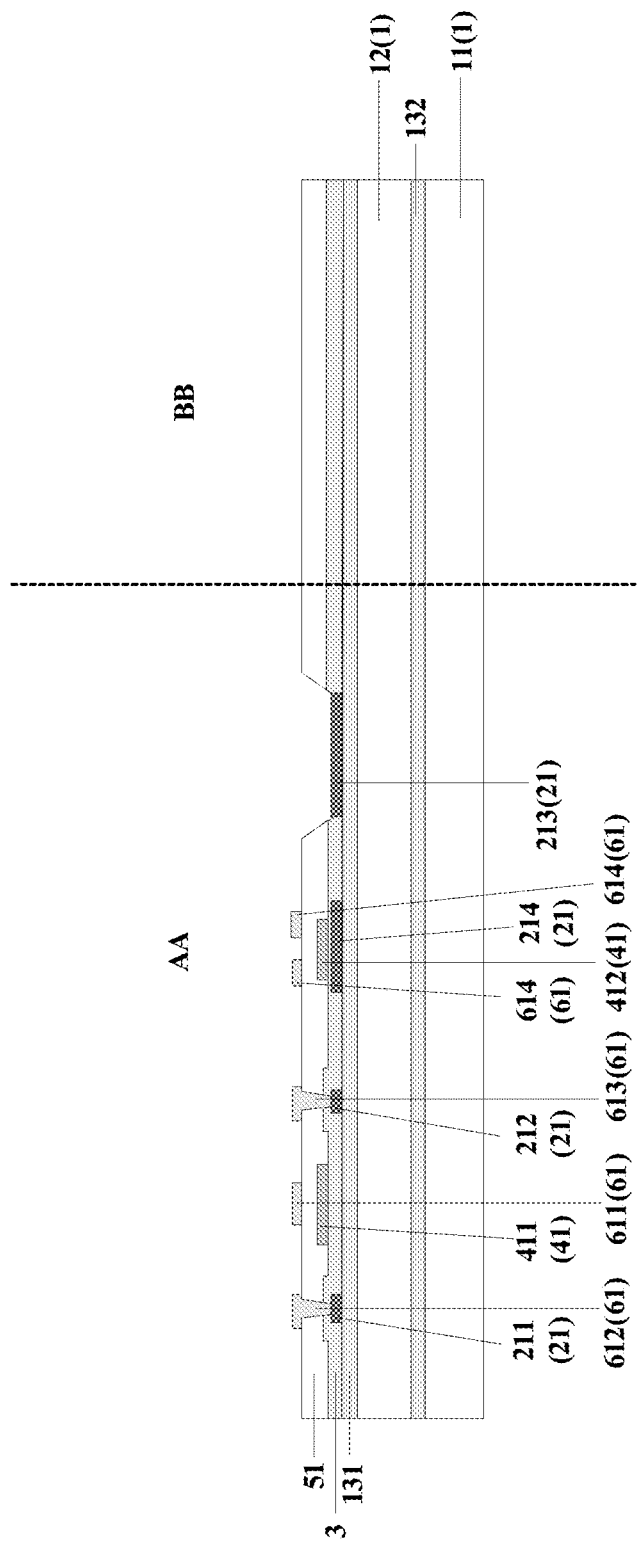
FIG. 9 is a schematic structural diagram of a display substrate after a first gate layer is prepared, provided in an embodiment of the present disclosure.

Step IV. a Gate1 metal layer (i.e., a first gate layer 61) is deposited, the material of the Gate1 metal layer may be Mo or Mo alloy, and a second gate electrode 611, a first connecting electrode 612, a second connecting electrode 613, and a second capacitor electrode 614 with a hollow area of the storage capacitor Cst are prepared by patterning, as shown in FIG. 9.

Figure 10:
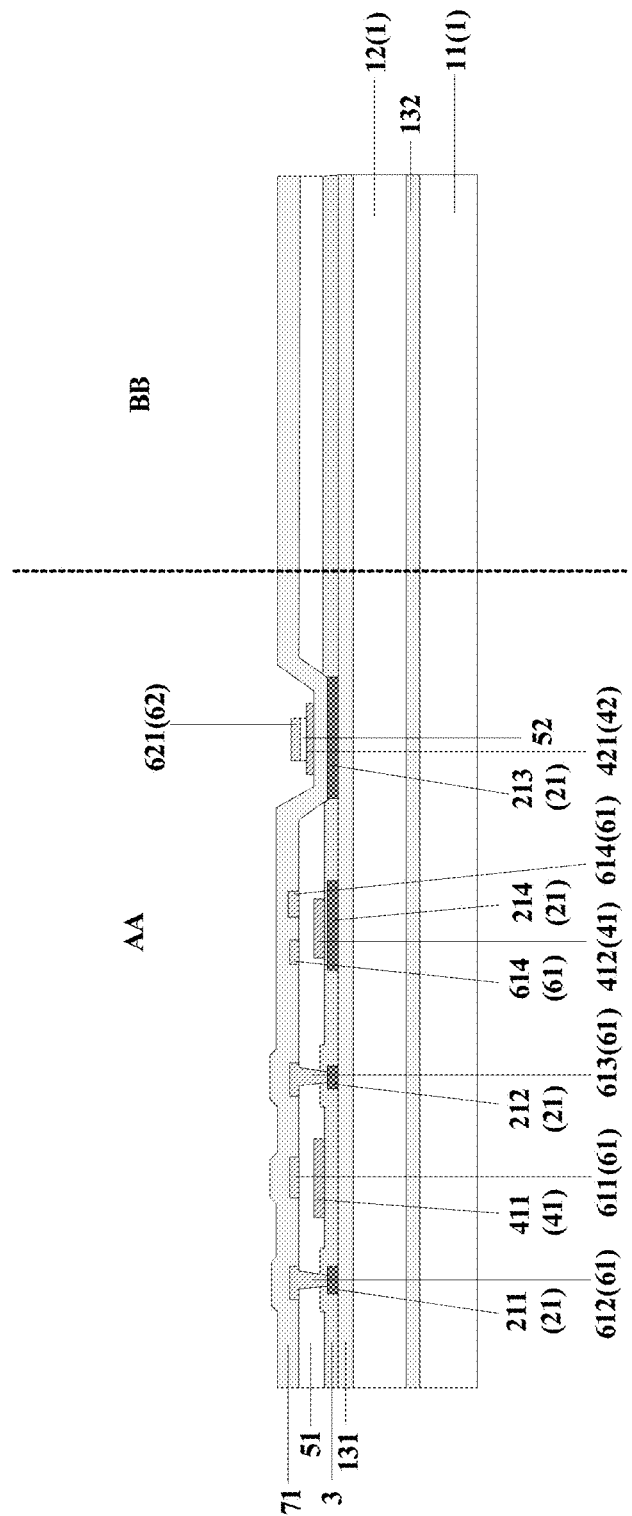
FIG. 10 is a schematic structural diagram of a display substrate after a first interlayer dielectric layer is prepared, provided in an embodiment of the present disclosure.

Step V. Then a first interlayer dielectric layer 71 (ILD1 layer) is deposited, which may be a composite layer of SiN and SiO, with a thickness of 400 um-600 um, with SiN being in a lower layer and SiO being in an upper layer. And then an oxide active layer 421, a second gate insulating layer 52, and a top gate electrode (i.e., a third gate electrode 621) of the oxide TFT are prepared by patterning. The third gate electrode 621 and the second gate insulating layer 52 have same patterns and are prepared by a step etching method by using a mask process. The oxide active layer 421 is a metal oxide, which may be made of indium gallium zinc oxide (IGZO), exposing, on both sides, portions to contact the second source-drain electrodes, as shown in FIG. 10.

Figure 11:
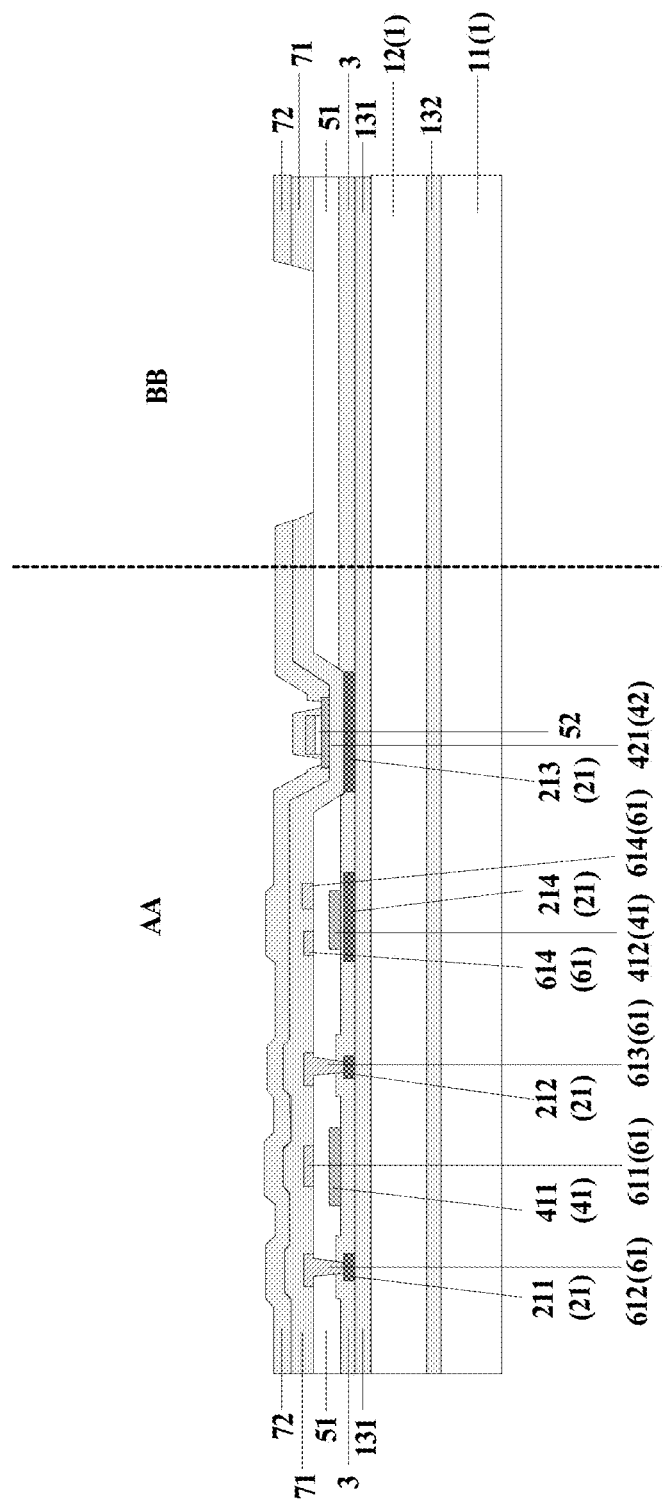
FIG. 11 is a schematic structural diagram of a display substrate after a second interlayer dielectric layer is prepared, provided in an embodiment of the present disclosure.

Step VI. A second interlayer dielectric layer 72 (i.e., an ILD2 layer) is deposited, which may be made of SiO, and may have a thickness of 400 um-600 um. And then contact holes are prepared by patterning, that is, a via hole exposing the oxide active layer 421 is prepared in a display area AA (i.e., an active array area), and a via hole exposing the first gate insulating layer is prepared in a bending area BB, (i.e., a first via hole EB1 is prepared and a pad bending process is performed), as shown in FIG. 11.

Figure 12:
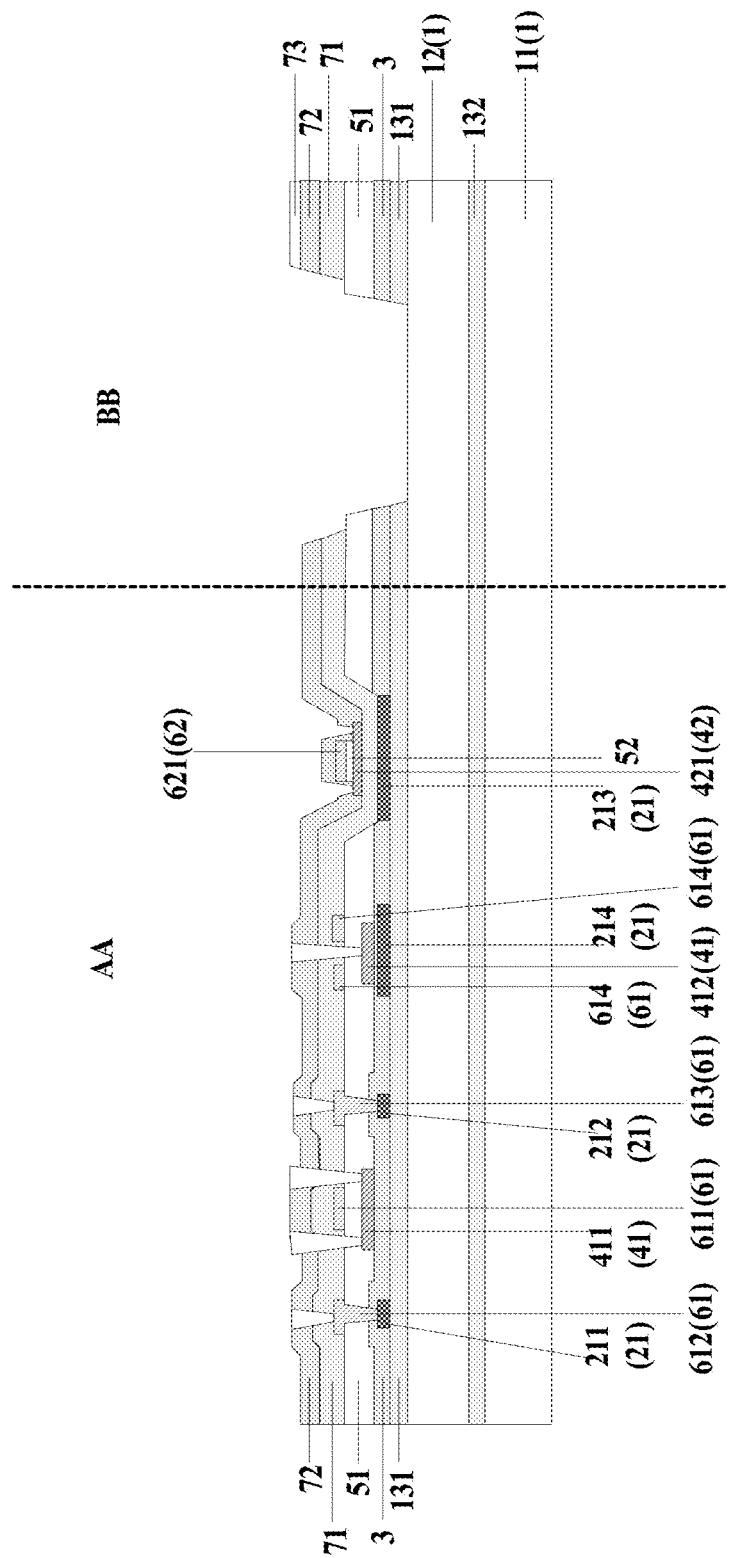
FIG. 12 is a schematic structural diagram of a display substrate after a second interlayer dielectric layer with holes are prepared, provided in an embodiment of the present disclosure.

Step VII. Then via holes exposing the first connecting electrode 612 and the second connecting electrode 613, a via hole exposing one end of the poly-silicon active layer 411, and a via hole exposing the other end of the poly-silicon active layer 411 (i.e., LTPS via holes) are prepared. And at the same time, a via hole (i.e., a second via hole EB2) exposing the base substrate 1 is prepared in a bending area BB, the boundaries of EB1 and EB2 may be aligned or form a step-like transition area, as shown in FIG. 12.

Figure 13:
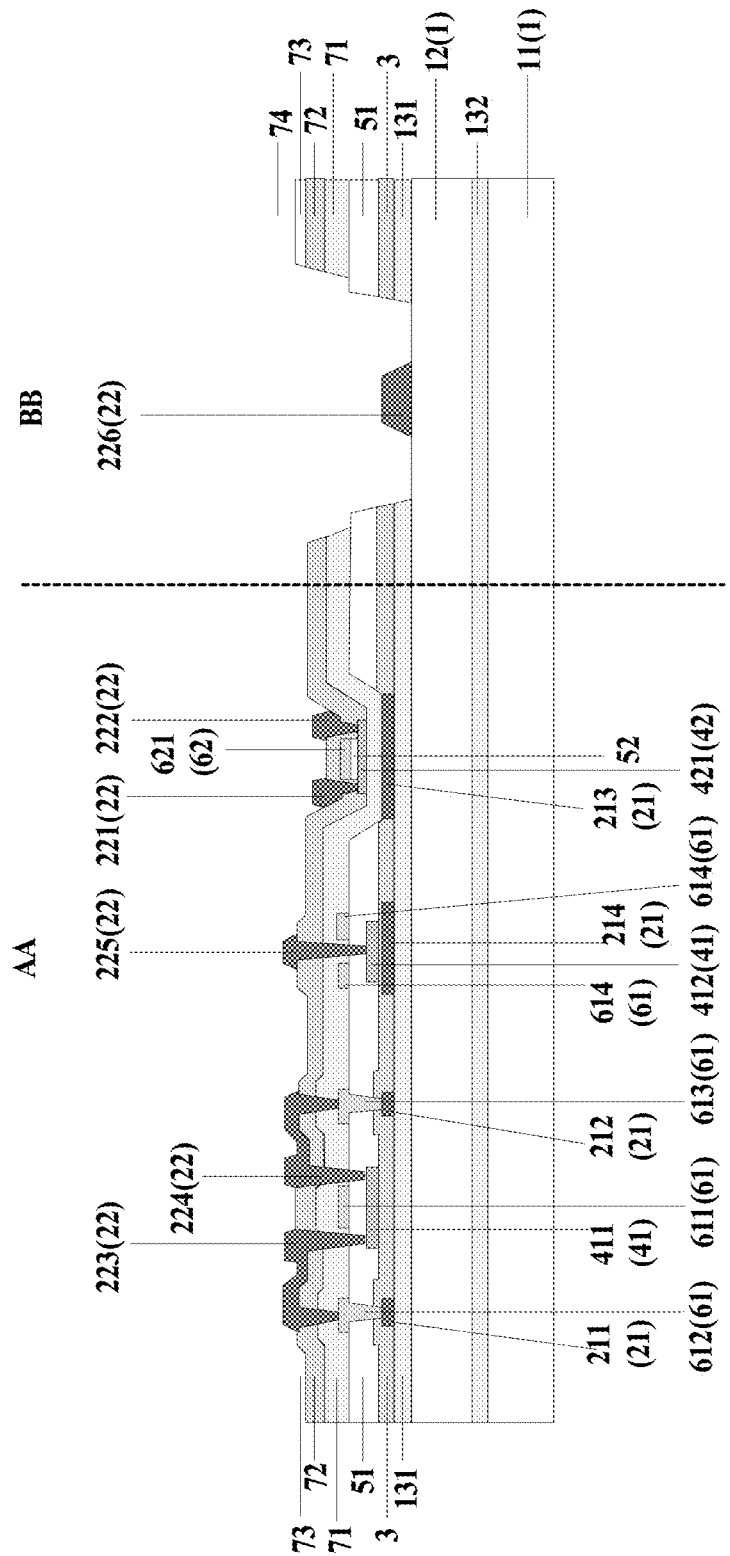
FIG. 13 is a schematic structural diagram of a display substrate after a second source-drain layer is prepared, provided in an embodiment of the present disclosure.

Step VIII. A second source-drain layer 22 (i.e., an SD2 layer) is prepared. The layer mainly includes a second source 221 and a second drain 222 of the oxide TFT in contact with the storage capacitor Cst, as well as a first lapping electrode 223 and a second lapping electrode 224 of LTPS TFT to achieve contact with the first connecting electrode 612. A power line 226 is prepared in the bending area BB. A single layer of power line 226 may be prepared, as shown in FIG. 13, or double layers of power lines may be made. The double layers of power lines are conducive to reducing the resistance of the power lines. In the case of preparing the double layers of power lines, the other layer of power line may be prepared at the time of preparing the first source-drain layer 21.

Figure 14:
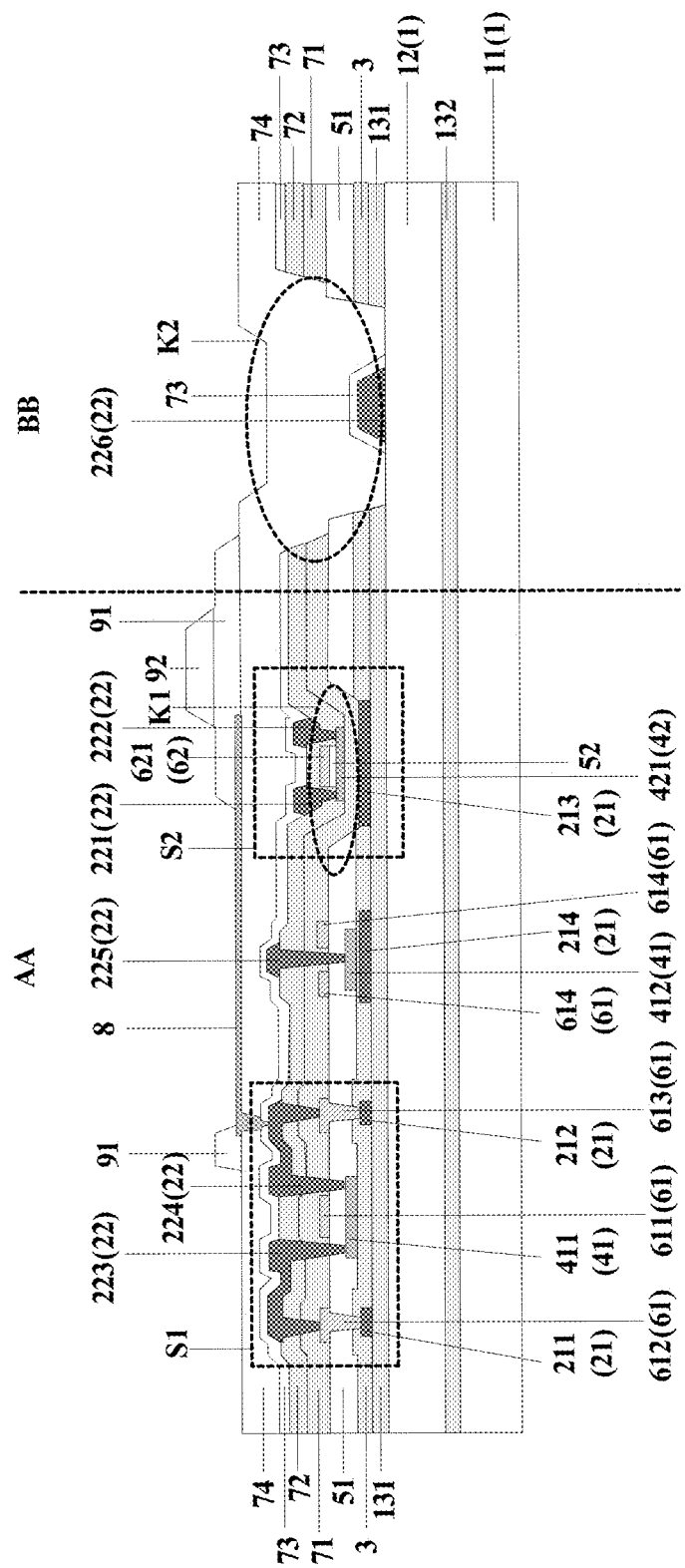
FIG. 14 is a schematic structural diagram of a display substrate after a spacer is prepared, provided in an embodiment of the present disclosure.

Step IX. Then a passivation layer 73 (i.e., a PVX layer), which made be one layer or a composite layer of SiO or SiNx, a planarization layer 74 (i.e., a PLN layer), an anode layer 8 (anode), a pixel defining layer 91 (PDL), and a spacer 92 (PS layer) are prepared successively. Finally, preparation of an LTPO device is completed, as shown in FIG. 14.

Embodiments of the present disclosure have the following beneficial effects: in the display substrate provided in embodiments of the present disclosure, the first source-drain electrodes of the low-temperature poly-silicon transistor and the first gate electrode of the oxide transistor are disposed in a first source-drain layer, and the second gate electrode of the low-temperature poly-silicon transistor and the connecting electrode are disposed in the first gate layer, and the lapping electrode of the low-temperature poly-silicon transistor and the second source-drain electrodes of the oxide transistor are disposed in the second source-drain layer. That is, and the film layers of the oxide transistor are prepared simultaneously when the film layers of the low-temperature poly-silicon transistor are prepared, which achieves a high degree of integration and enables the display substrate to have both the low-temperature poly-silicon transistor and the oxide transistor, thus reducing the power consumption of the display substrate.

Obviously, those skilled in the art can make various modifications and variations to the present disclosure without departing from the spirit and scope of the present disclosure. Thus, the present disclosure is also intended to encompass these modifications and variations thereto so long as the modifications and variations come into the scope of the claims of the present disclosure and their equivalents.

What is claimed is:

1. A display substrate, provided with a first area in which a low temperature poly-silicon transistor is deposited and a second area in which an oxide transistor is deposited, and the display substrate comprising:
   a base substrate;
   a first source drain layer on a side of the base substrate, wherein the first source drain layer comprises a first source electrode and a first drain electrode in the first area, and a first gate electrode in the second area;
   a first active layer on a side of the first source drain layer facing away from the base substrate, wherein the first active layer comprises a poly-silicon active layer in the first area;
   a first gate layer on a side of the first active layer facing away from the first source drain source drain layer, wherein the first gate layer comprises a second gate electrode and a connecting electrode in the first area, and the connecting electrode is electrically connected to the first source electrode and the first drain electrode;
   a second active layer on a side of the first gate layer facing away from the first active layer, wherein the second active layer comprises an oxide active layer in the second area;
   a second gate layer on a side of the second active layer facing away from the first gate layer, wherein the second gate layer comprises a third gate electrode in the second area; and
   a second source drain layer on a side of the second gate layer facing away from the second active layer, wherein the second source drain layer comprises a second source electrode and a second drain electrode in the second area, and a lapping electrode in the first area, the second source electrode and the second drain electrode are electrically connected to the oxide active layer; one end of the lapping electrode is electrically connected to the connecting electrode, and another end of the lapping electrode is electrically connected to the poly-silicon active layer.

2. The display substrate of claim 1, wherein:
   the first source drain layer further comprises a first capacitor electrode;
   the first active layer further comprises a second capacitor electrode; and
   the first gate layer further comprises a third capacitor electrode;
   wherein an orthographic projection of the third capacitor electrode on the base substrate and an orthographic projection of the second capacitor electrode on the base substrate have an overlap area, and the orthographic projection of the second capacitor electrode on the base substrate and an orthographic projection of the first capacitor electrode on the base substrate have an overlap area.

3. The display substrate of claim 2, wherein:
   the third capacitor electrode is provided with a hollow area;
   the second source drain layer further comprises a capacitor connecting line; and
   the capacitor connecting line is electrically connected to the second capacitor electrode through the hollow area.

4. The display substrate of claim 1, further comprising:
   a first gate insulating layer between the first active layer and the first gate layer; and
   a buffer layer between the first active layer and the first source drain layer;
   wherein in an area where the first gate electrode is located, the buffer layer and the first gate insulating layer are provided with a first groove exposing the first gate electrode; and the oxide transistor is in an area where the first groove is located.

5. The display substrate of claim 4, wherein the display substrate is provided with a display area, and a bending area in a peripheral area of the display area;
   the display substrate is provided with, in the bending area, a second groove exposing the base substrate;
   the second source drain layer further comprises, in the bending area, a power line in the second groove; and
   the display substrate further comprises a planarization layer on a side of the second source drain layer facing away from the second gate layer, and the planarization layer fills other areas of the second groove than an area where the power line is located.

6. The display substrate of claim 1, wherein the display substrate further comprises a second gate insulating layer between the second active layer and the second gate layer;
   a pattern of the second gate insulating layer is same as a pattern of the third gate electrode; and
   an area of an orthographic projection of the second gate insulating layer on the base substrate is smaller than an area of an orthographic projection of the oxide active layer on the base substrate.

7. The display substrate of claim 1, wherein a material of the first source drain layer is aluminum alloy material or molybdenum alloy material.

8. The display substrate of claim 1, wherein the oxide transistor is a switching transistor, and the low temperature poly-silicon transistor is a driving transistor.

9. A display panel, comprising the display substrate of claim 1.

10. The display panel of claim 9, wherein
the first source drain layer further comprises a first capacitor electrode;
the first active layer further comprises a second capacitor electrode; and
the first gate layer further comprises a third capacitor electrode;
wherein an orthographic projection of the third capacitor electrode on the base substrate and an orthographic projection of the second capacitor electrode on the base substrate have an overlap area, and the orthographic projection of the second capacitor electrode on the base substrate and an orthographic projection of the first capacitor electrode on the base substrate have an overlap area.

11. The display panel of claim 10, wherein
the third capacitor electrode is provided with a hollow area;
the second source drain layer further comprises a capacitor connecting line; and
the capacitor connecting line is electrically connected to the second capacitor electrode through the hollow area.

12. The display panel of claim 9, the display substrate further comprising:
a first gate insulating layer between the first active layer and the first gate layer; and
a buffer layer between the first active layer and the first source drain layer;
wherein in an area where the first gate electrode is located, the buffer layer and the first gate insulating layer are provided with a first groove exposing the first gate; and
the oxide transistor is in an area where the first groove is located.

13. The display panel of claim 12, wherein the display substrate is provided with a display area, and a bending area located in a peripheral area of the display area;
the display substrate is provided with, in the bending area, a second groove exposing the base substrate;
the second source drain layer further comprises, in the bending area, a power line in the second groove;
the display substrate further comprises a planarization layer on a side of the second source drain layer facing away from the second gate layer, and the planarization layer fills other areas of the second groove than an area where the power line is located.

14. The display panel of claim 9, wherein the display substrate further comprises a second gate insulating layer located between the second active layer and the second gate layer;
a pattern of the second gate insulating layer is same as a pattern of the third gate electrode; and
an area of an orthographic projection of the second gate insulating layer on the base substrate is smaller than an area of an orthographic projection of the oxide active layer on the base substrate.

15. The display panel of claim 9, wherein a material of the first source drain layer is aluminum alloy material or molybdenum alloy material.

16. A method for preparing a display substrate, comprising:
providing a base substrate;
forming, on a side of the base substrate, a first source drain layer, wherein the first source drain layer comprises a first source electrode and a first drain electrode in a first area and a first gate electrode in a second area;
forming, on a side of the first source drain layer facing away from the base substrate, a first active layer, wherein the first active layer comprises a poly-silicon active layer in the first area;
forming, on a side of the first active layer facing away from the first source drain layer, a first gate layer, wherein the first gate layer comprises a second gate electrode and a connecting electrode in the first area, and the connecting electrode is electrically connected to the first source electrode and the first drain electrode;
forming, on a side of the first gate layer facing away from the first active layer, a second active layer, wherein the second active layer comprises an oxide active layer in the second area;
forming, on a side of the second active layer facing away from the first gate layer, a second gate layer, wherein the second gate layer comprises a third gate electrode in the second area; and
forming, on a side of the second gate layer facing away from the second active layer, a second source drain layer, wherein the second source drain layer comprises a second source electrode and a second drain electrode in the second area and a lapping electrode in the first area, the second source electrode and the second drain electrode are electrically connected to the oxide active layer, one end of the lapping electrode is electrically connected to the connecting electrode, and another end of the lapping electrode is electrically connected to the poly-silicon active layer.

17. The method for preparing a display substrate of claim 16, wherein when forming, on the side of the base substrate, the first source drain layer, the method further comprises forming a first capacitor electrode;
when forming, on the side of the first source drain layer facing away from the base substrate, the first active layer, the method further comprises forming a second capacitor electrode; and
when forming, on the side of the first active layer facing away from the first source drain layer, the first gate layer, the method further comprises forming a third capacitor electrode.

18. The manufacturing method of claim 17, wherein forming the third capacitor electrode comprises forming the third capacitor electrode provided with a hollow area; and
when forming, on the side of the second gate layer facing away from the second active layer, the second source drain layer, the method further comprises forming a capacitor connecting line electrically connected to the second capacitor electrode through the hollow area.

19. The method for preparing a display substrate of claim 16, wherein after forming, on the side of the base substrate, the first source drain layer, and before forming, on the side of the first source drain layer facing away from the base substrate, the first active layer, the method further comprises forming a buffer layer; and
after forming, on the side of the first source drain layer facing away from the base substrate, the first active layer, and before forming, on the side of the first active layer facing away from the first source drain layer, the first gate layer, the method further comprises forming a first gate insulating layer, and etching the first gate insulating layer to form a first groove exposing the first gate electrode.

20. The method for preparing a display substrate of claim 16, wherein when forming, on the side of the second gate layer facing away from the second active layer, the second source drain layer, the method further comprises forming a power line.

* * * * *